US011323117B1

United States Patent
Tanguay et al.

(10) Patent No.: US 11,323,117 B1
(45) Date of Patent: May 3, 2022

(54) DATA SAMPLING WITH LOOP-UNROLLED DECISION FEEDBACK EQUALIZATION

(71) Applicant: Cadence Design Systems, Inc., San Jose, CA (US)

(72) Inventors: Louis-Francois Tanguay, Montréal (CA); Jean-Francois Delage, Montréal (CA); Guillaume Fortin, Montréal (CA)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 17/305,571

(22) Filed: Jul. 9, 2021

(51) Int. Cl.
  *H03K 19/094* (2006.01)
  *H03K 19/20* (2006.01)
  *H03K 19/17736* (2020.01)
  *H03K 19/096* (2006.01)
(52) U.S. Cl.
  CPC ..... *H03K 19/09425* (2013.01); *H03K 19/096* (2013.01); *H03K 19/17744* (2013.01); *H03K 19/20* (2013.01)

(58) Field of Classification Search
  None
  See application file for complete search history.

(56) References Cited

U.S. PATENT DOCUMENTS

| 9,628,302 | B2* | 4/2017 | Francese | H04L 25/03057 |
| 11,044,124 | B1* | 6/2021 | Goyal | H04L 25/03885 |
| 2015/0312060 | A1* | 10/2015 | Sinha | H04L 25/14 |
| | | | | 375/233 |
| 2017/0373889 | A1* | 12/2017 | Sakai | H03K 3/037 |

* cited by examiner

*Primary Examiner* — Jany Richardson
(74) *Attorney, Agent, or Firm* — Schwegman Lundberg & Woessner, P.A.

(57) ABSTRACT

Various embodiments provide for data sampling with loop-unrolled decision feedback equalization. In particular, some embodiments provide for an unrolled first-tap Decision Feedback Equalizer (DFE) loop that comprises parallel data samplers that each include a tri-state output.

20 Claims, 11 Drawing Sheets

DATA SAMPLING WITH LOOP-UNROLLED DECISION FEEDBACK EQUALIZATION

TECHNICAL FIELD

Embodiments described herein relate to circuits and, more particularly, to data sampling with loop-unrolled decision feedback equalization.

BACKGROUND

Serial data links (or TX/RX links) convey data over various media, such as a cable, a board trace, or backplane. Such a medium is often referred to as a channel. A channel can be imperfect and cause impairments on signals transmitted over the channel, such as attenuation, reflection, and noise (e.g., crosstalk). These impairments can lead to transmission errors. The quality of a channel can determine an upper limit on its achievable rate. Additionally, other impairments in a serial data link can degrade overall system performance. For instance, circuit non-idealities can also cause a degradation in a system's performance. Overall, minimizing impairments can enable a channel to reach or achieve higher link rates.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
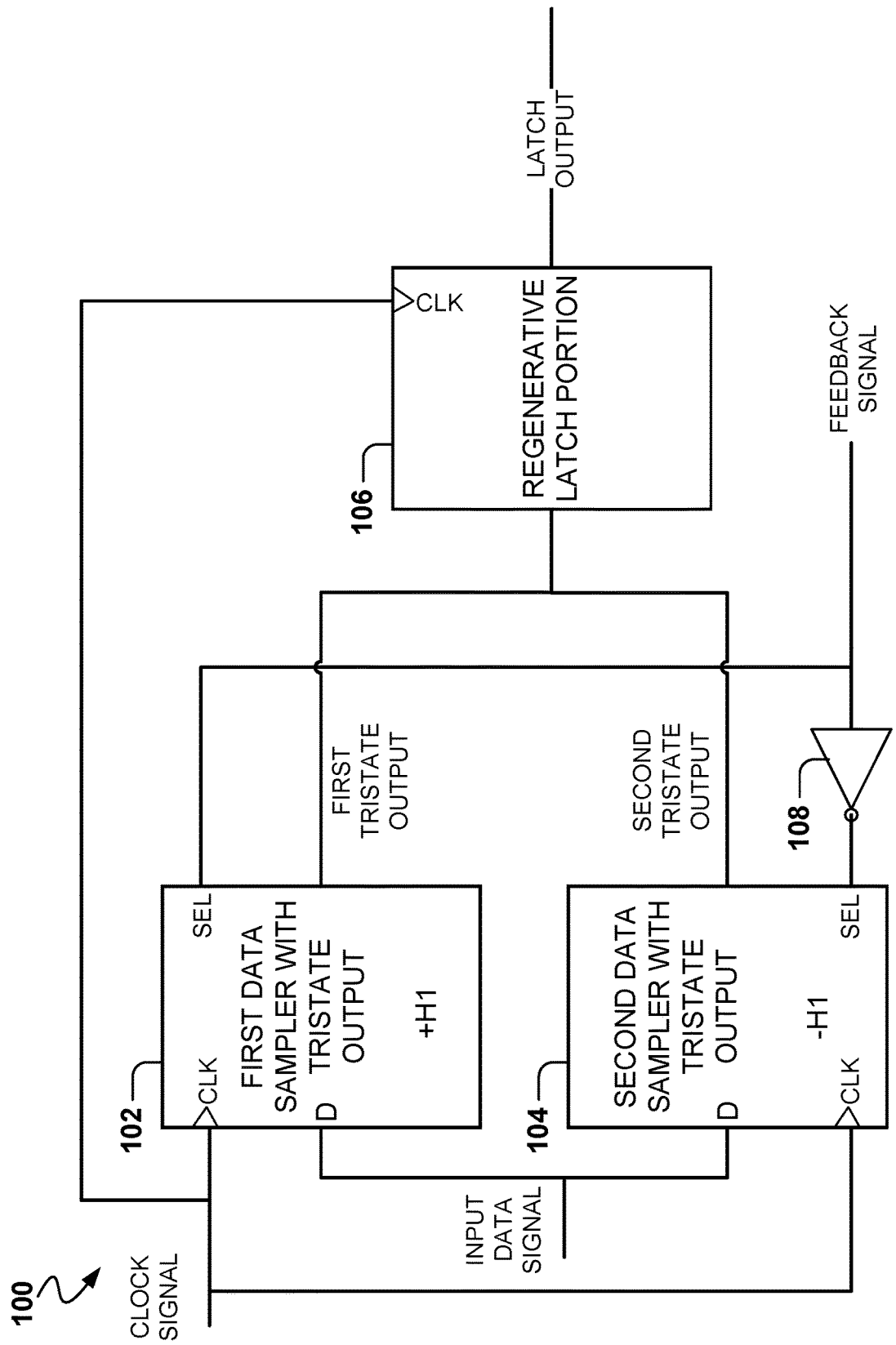
FIGS. 1 through 6 are schematics illustrating example circuits for data sampling with loop-unrolled decision feedback equalization, in accordance with various embodiments.

Various embodiments provide for data sampling with loop-unrolled decision feedback equalization. For some embodiments, the data sampling described herein can be part of a circuit for high-speed serial data communication, such as a serializer/deserializer (SerDes) circuit. A data receiver (or receiver) uses a data sampler to retrieve data bit values, detect transitions, assess signal amplitude of a data signal, or some combination thereof. Usually, a data signal received (over a channel) by a data receiver can be heavily attenuated and the signal amplitude to be detected can range from a few millivolt (mV) to hundreds of mV.

Traditionally, a data receiver comprises data comparators, clock comparators, and error comparators, each of which uses a circuit to sample a received data signal. Both data comparators and clock comparators can be used to quickly and reliably sample a received data signal. For example, a data comparator can sample the eye of a received data signal at its center and recover a data stream. For a circuit using a loop-unrolled Decision Feedback Equalizer (DFE) (also referred to as an unrolled DFE), at least two data comparators operating at different threshold voltage values can be used. A clock comparator, which can sample the eye at its edges, may be used to perform clock recovery and alignment at the data receiver. In contrast, an error comparator is often used to measure the eye shape for diagnostic purposes or to position a data sampler at the best sampling location using a servo loop. A conventional error comparator is usually able to sample any point in the eye. An error comparator typically uses a data sampler that has a large threshold voltage range (e.g., one that can cover for the sum of random offsets, target threshold voltage, and first tap value; voltage range can reach 300-400 mV peak differential).

As data rates increase between a data transmitter and a data receiver, bit duration (also referred to as a unit interval or UI) gets smaller; and smaller UIs reduce allowed timing errors within a data receiver. Higher data rates also means that overall, a data receiver has to perform operations faster. Half-rate and quarter-rate data sampling (by a data sampler) can be used to reduce speed requirements of the clocking generation and distribution inside receiver. For example, in a half-rate data receiver, two clock signals spaced 180° apart can be used, where each clock signal's rising edge causes sampling of one incoming bit from a received data signal. Usually, for a half-rate data receiver, twice as many clock signals running at half the line rate speed are required. In comparison, in a quarter-rate data receiver, four clock signals spaced 90° apart can be used, where each clock signal's rising edge causes sampling of one incoming bit from a received data signal. Usually, for a quarter-rate data receiver, four times as many clock signals running at a quarter of the line rate speed are required. Additionally, another set of complementary clock signals in quadrature can be used to sample transitions. A quarter-rate data receiver is often used for high rate data links, such as those operating at 32 Gbps.

Conventional data receivers are known to use a DFE (which is a non-linear equalizer) to compensate for inter-symbol interface (ISI) present within a received data signal (e.g., received from a data transmitter). Specifically, a DFE can use a data sampler to determine (e.g., make a decision on) a value of an incoming bit of a received data signal (e.g., thereby quantizing the received data signal) for a current UI, can obtain a value of a preceding bit (e.g., value of bit from one UI before) via a first tap of the DFE, can scale the value of the preceding bit by a coefficient (e.g., tap weight) associated with the first tap, and can apply the scaled value to a next incoming bit of the received signal by adding the scaled value to, or subtracting the scaled value from, the received signal via an analog summer. Generally, where only DFE-based equalization is used at a data receiver, the one or more tap weights (associated with the different taps) of the DFE would equal the non-equalized channel pulse response values for the incoming data signal (e.g., [a1, a2, . . . an]).

In conventional data receivers that use a direct-feedback DFE, a first tap of the DFE is expected to settle within one UI (which can represent a one-bit period). However, at high data rates, closing the timing of a first tap of the DFE (with direct feedback) is usually not possible. For instance, at a data rate of 32 Gpbs, operations of a data sampler of a DFE, a feedback tap-weighting logic of the DFE, and an analog summer of the DFE should settle within 31.25 ps (which represents one UI for a data link rated at 32 Gpbs) for the DFE to properly operate. Given that current fabrication technologies do not enable a DFE to meet such a timing requirement (e.g., a UI of 31.25 ps is too small to permit a DFE to feedback and add/subtract ISI to a next bit of the received data signal), conventional data receivers often use a DFE with tap loop unrolling. For example, the loop of the first tap of a one-tap DFE can be "unrolled" such that the feedback tap-weight logic and analog summer are replaced with a multiplexer (MUX) and two different data samplers (with different threshold voltages) are used to pre-compute two possibilities for the incoming bit of the received data signal at a current UI. Depending on the implementation, more than one tap loop of a DFE can be unrolled, with the number of data samplers increasing exponentially based on the number of unrolled taps (e.g., $2^N$, where N represents the number tap loops unrolled).

A half-rate two-tap DFE with a first tap unrolled can be used in a data receiver to relax clocking requirements and help reduce power usage of the data receiver. For a half-rate two-tap DFE with a first tap unrolled, even bits of a received data signal can be sampled on a rising edge of a clock signal, while odd bits of the received data signal can be sampled on a falling edge of the clock signal. Unfortunately, a conventional half-rate two-tap DFE with a first tap unrolled can still run into timing limitations at high data rates, such as 32 Gbps. In particular, for such a conventional DFE, applying feedback based on the first tap would need to settle within one UI period (e.g., 31.25 ps), and applying feedback based on the second tap would need to settle within two UI periods (e.g., 62.5 ps), which can entail the first tap selection value arriving not much later than one UI after the previous bit gets sampled; any extra delay in that sense can reduce the effective time allowed for the second tap to settle. Unfortunately, such timing can be difficult to achieve by conventional data receivers, especially for slow process corners and/or under low supply voltage conditions which result in degraded device performance.

Various embodiments described herein provide for data sampling with loop-unrolled decision feedback equalization that can overcome the timing limitations of conventional DFEs. For example, some embodiments can reduce loop delay within a DFE, especially a two-tap DFE, when compared to a conventional DFE. In particular, some embodiments can remove or replace a multiplexer or a latch stage typically found in a conventional DFE. For some embodiments, an unrolled first-tap DFE loop comprises parallel data samplers (e.g., one having a threshold target voltage set to apply a first-tap coefficient with a first polarity (e.g., +H1), and another having a threshold target voltage set to apply the first-tap coefficient with a second polarity (e.g., −H1) that each include a tri-state output (e.g., a tri-state output stage). According to some embodiments, where an output of a sampler is not selected to generate an output (e.g., the sampler is inactive), the tri-state output of the sampler is set to a high-impedance state, and where the output of the sampler is selected to generate an output (e.g., sampler is active), the tri-state output (of the sampler) is set to pass through an output. Additionally, for some embodiments, the unrolled first-tap DFE loop comprises a regenerative latch portion (e.g., a regenerative latch stage) configured to regenerate and hold a value provided by one of the data samplers that is selected to generate an output (e.g., the data sampler that is active). The regenerative latch portion can be configured to hold the value while the related samplers go into a reset phase.

Data sampling according to an embodiment can, for example, be used with a data receiver capable of high data rates, such as 32 Gbps, where the two-tap DFE loop can include tap-weight logic (e.g., second tap-weight logic) that can settle within two unit intervals (UIs) (e.g., within 62.5 ps).

As used herein, a data sampler can comprise a data slicer (or slicer) that is an edge-triggered device configured to sample an input data signal on a rising edge of a clock signal and reset when the clock signal is low.

As used herein, a tri-state output (or tri-state output stage) is a three-state output, which can comprise a logic gate (e.g., an inverter or buffer) that can be set to one of three logic states, such as a logical value of 0, a logical value of 1, and an inactive (e.g., high-impedance or open-circuit) state.

As used herein, a current-mode output stage can provide an output current that is steered between two alternate paths depending on whether a logic zero or logic one is being represented.

As used herein, a tap coefficient with a first polarity (e.g., +H) can comprise a positive or a negative value, and the (same) tap coefficient with a second polarity (e.g., −H) can comprise a positive value or negative value. For some embodiments, a tap coefficient with a first polarity and the tap coefficient with a second polarity are such that the first and second polarities are opposite polarities. For instance, for some embodiments, a first-tap coefficient (e.g., H1) with a first polarity (e.g., +H1) and the first-tap coefficient (e.g., H1) with a second polarity (e.g., −H1) are complementary values, where the two coefficients have the same absolute value but complementary polarity.

Reference will now be made in detail to embodiments of the present disclosure, examples of which are illustrated in the appended drawings. The present disclosure may, however, be embodied in many different forms and should not be construed as being limited to the embodiments set forth herein.

FIGS. 1 through 6 are schematics illustrating example circuits for data sampling with loop-unrolled decision feedback equalization, in accordance with various embodiments.

Referring now to FIG. 1, a circuit 100 is illustrated, which can represent at least a portion of a larger circuit that implements data sampling with loop-unrolled decision feedback equalization (DFE), in accordance with various embodiments. The circuit 100 as shown comprises a first data sampler 102 with a tri-state output (hereafter, the first data sampler 102), a second data sampler 104 with a tri-state output (hereafter, the second data sampler 104), and a (shared) regenerative latch portion 106, each of which is operated by a clock signal. Each of the first data sampler 102 and the second data sampler 104 comprises a clock signal input, a data input (D), and a selection input (SEL) that controls the data sampler's tri-state output (e.g., controls the state of the tri-state output).

The first data sampler 102 is configured to receive an input data signal and the clock signal, generate a first sample signal based on a first-tap coefficient with a first polarity (e.g., +H1) (e.g., by sampling the input data signal while applying the first-tap coefficient with the first polarity to sample), and output the first sample signal by the tri-state output of the first data sampler 102. As noted herein, the first-tap coefficient with the first polarity can comprise a negative or positive value. According to some embodiments, the input data signal comprises a differential pair of data signals. Additionally, the first-tap coefficient is associated with a first tap of the DFE. The tri-state output of the first data sampler 102 is controlled by a first selection signal (e.g., first selection bit) received via the selection input of the first data sampler 102. As shown, the first selection signal (received by the first data sampler 102) comprises a feedback signal. For various embodiments, the feedback signal represents a preceding bit carried (e.g., one prior UI) by the input data signal. For instance, the feedback signal can be provided by another DFE loop operating using a second clock signal (e.g., the second clock signal having a 180-degree phase difference from the clock signal of the circuit 100).

According to some embodiments, the tri-state output of the first data sampler 102 is disabled in response to the first selection signal (e.g., first selection bit) indicating selection of a disabled state. For example, the tri-state output can be disabled by being set to a high-impedance state, such that the output of the first data sampler 102 does not output (e.g., contribute) to the regenerative latch portion 106 or impact the operation of the regenerative latch portion 106. For some embodiments, the tri-state output of the first data sampler 102 is enabled in response to the first selection signal indicating selection of an enabled state.

The second data sampler 104 is configured to receive the input data signal and the clock signal, generate a second sample signal based on the first-tap coefficient with a second polarity (e.g., –H1) (e.g., by sampling the input data signal while applying the first-tap coefficient with the second polarity to sample), and output the second sample signal by the tri-state output of the second data sampler 104. As noted herein, the first-tap coefficient with the second polarity can comprise a positive or negative value. For various embodiments, the first-tap coefficient with the first polarity and the first-tap coefficient with the second polarity have complementary values. As described herein, the first-tap coefficient is associated with a first tap of the DFE. The tri-state output of the second data sampler 104 is controlled by a second selection signal (e.g., second selection bit) received via the selection input of the second data sampler 104. As shown, the second selection signal (received by the second data sampler 104) comprises an inverted feedback signal, which is generated by an inverter 108 based on the feedback signal. Alternatively, for some embodiments, the inverter 108 illustrated is merely conceptual and not used or included by the circuit 100 to generate the inverted feedback signal. Rather, the inverted feedback signal can be generated as part of an output provided by the regenerative latch portion 106. For example, the regenerative latch portion 106 can provide a differential pair of output signals that are complementary (e.g., as in FIG. 2) and, accordingly, a prior stage output signal of the differential pair (e.g., for a preceding bit) can be used as the feedback signal for the first data sampler 102 and the other output signal of the differential pair (e.g., for a preceding bit) can be used as the inverted feedback signal for the second data sampler 104. By use of the first and the second selection signals, various embodiments can select only one of the first data sampler 102 and the second data sampler 104 to be active at a given time (e.g., during a given UI). For some embodiments, each of the first data sampler 102 and the second data sampler 104 has a signal output that is operating in current mode.

The regenerative latch portion 106 can be coupled to a data output (the tri-state output) of the first data sampler 102 and coupled to a data output (the tri-state output) of the second data sampler 104. For some embodiments, the regenerative latch portion 106 is configured to receive a sampler output signal (comprising the first sample signal or the first sample signal) from at least one of (the tri-state output of) the first data sampler 102 or (the tri-state output of) the second data sampler 104, to latch the sampler output signal based on the clock signal, to regenerate the latched sampler output signal, to provide (as latch output) the regenerated latched sampler output signal. According to various embodiments, the regenerated latched sampler output signal represents a logical value of an incoming bit carried by the input data signal. For some embodiments, the regenerative latch portion 106 comprises a cross-coupled inverter. The regenerative latch portion 106 can comprise a reset input to receive a reset signal, where the regenerative latch portion 106 resets a value when in reset phase and the reset signal is asserted, and regenerates when in regeneration phase (e.g., regeneration is enabled) and the reset signal is not asserted. For some embodiments, the reset signal for the regenerative latch portion 106 is generated based on the clock signal (e.g., the reset signal is generated by inverting the clock signal). Depending on the embodiment, the first data sampler 102 can comprise a dummy device that couples between the tri-state output of the first data sampler 102 and the regenerative latch portion 106; and the second data sampler 104 can comprise a dummy device that couples between the tri-state output of the second data sampler 104 and the regenerative latch portion 106.

Figure 2A:
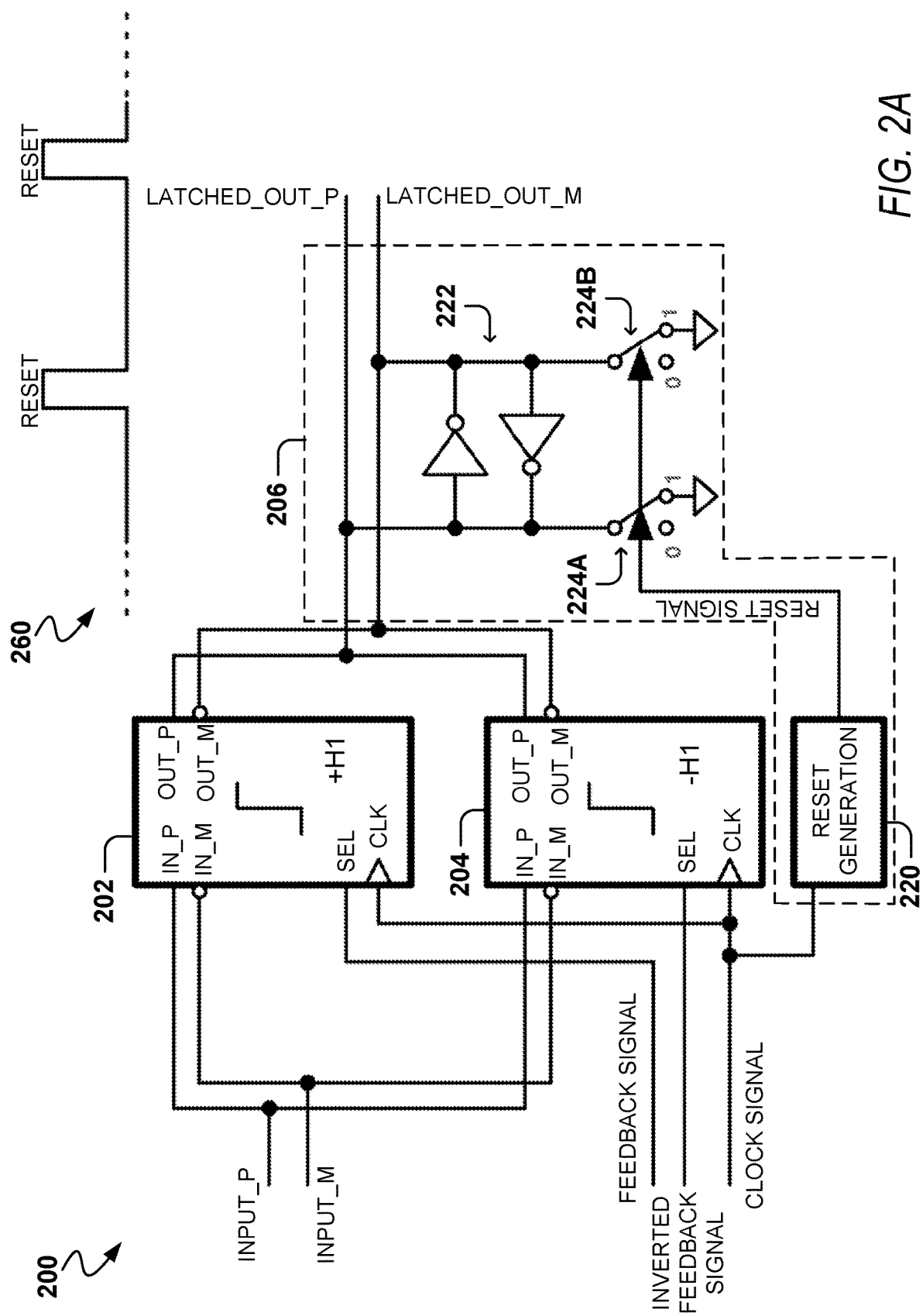

Referring now to FIG. 2A, a circuit 200 is illustrated, which can represent an example implementation of data sampling with loop-unrolled decision feedback equalization (DFE), in accordance with various embodiments. In FIG. 2, the circuit 200 comprises a first data sampler 202 with a tri-state output (hereafter, the first data sampler 202), a second data sampler 204 with a tri-state output (hereafter, the second data sampler 204), and a regenerative latch portion 206, each of which is operated by a clock signal.

As shown, the circuit 200 is configured to receive a differential pair of data signals via a positive input (INPUT_P) and a negative input (INPUT_M), and operate on the differential pair to generate a differential pair of output signals by way of a positive output (LATCHED_OUT_P) and a negative output (LATCHED_OUT_M). For various embodiments, the differential pair of output signals (provided by LATCHED_OUT_P and LATCHED_OUT_M) are complementary signals. For some embodiments, the circuit 200 represents an example implementation of the circuit 100 (of FIG. 1) that operates on a differential pair of data signals, where the first data sampler 202 represents an implementation of the first data sampler 102 of the circuit 100, the second data sampler 204 represents an implementation of the second data sampler 104 of the circuit 100, the regenerative latch portion 206 represents an implementation of the regenerative latch portion 106 of the circuit 100. As shown, the feedback signal is received by the selection input (SEL) of the first data sampler 202, and the inverted feedback signal is received by the selection input (SEL) of the second data sampler 204. For some embodiments, the output signal from LATCHED_OUT_P for a prior UI can be used as the feedback signal, while the output signal from LATCHED_OUT_M for the (same) prior UI can be used as the inverted feedback signal.

As shown, the regenerative latch portion 206 comprises a reset generation block 220, cross-coupled inverters 222, a first switch 224A, and a second switch 224B. In the regenerative latch portion 206, the reset generation block 220 generates a reset signal based on (e.g., by inverting) the clock signal. For some embodiments, the regenerative latch portion 206 latches/holds resets a value when in reset phase and the reset signal is asserted, and regenerates when in regeneration phase (e.g., regeneration is enabled) and the reset signal is not asserted. As illustrated, the reset signal controls whether the first and the second switches 224A, 224B are open or closed. The cross-coupled inverters 222 can enable regeneration within the regenerative latch portion 206. Once a differential pair of output signals is latched, the latched differential pair is outputted by regenerative latch portion 206 via the positive output (LATCHED_OUT_P) and the negative output (LATCHED_OUT_M).

The graph 260 illustrates an example of regeneration and reset phases of the regenerative latch portion 206 during operation. As shown, for some embodiments, reset phases are shorter in duration than regenerative phases of the regenerative latch portion 206, which can maximize the regeneration time.

Figure 2B:
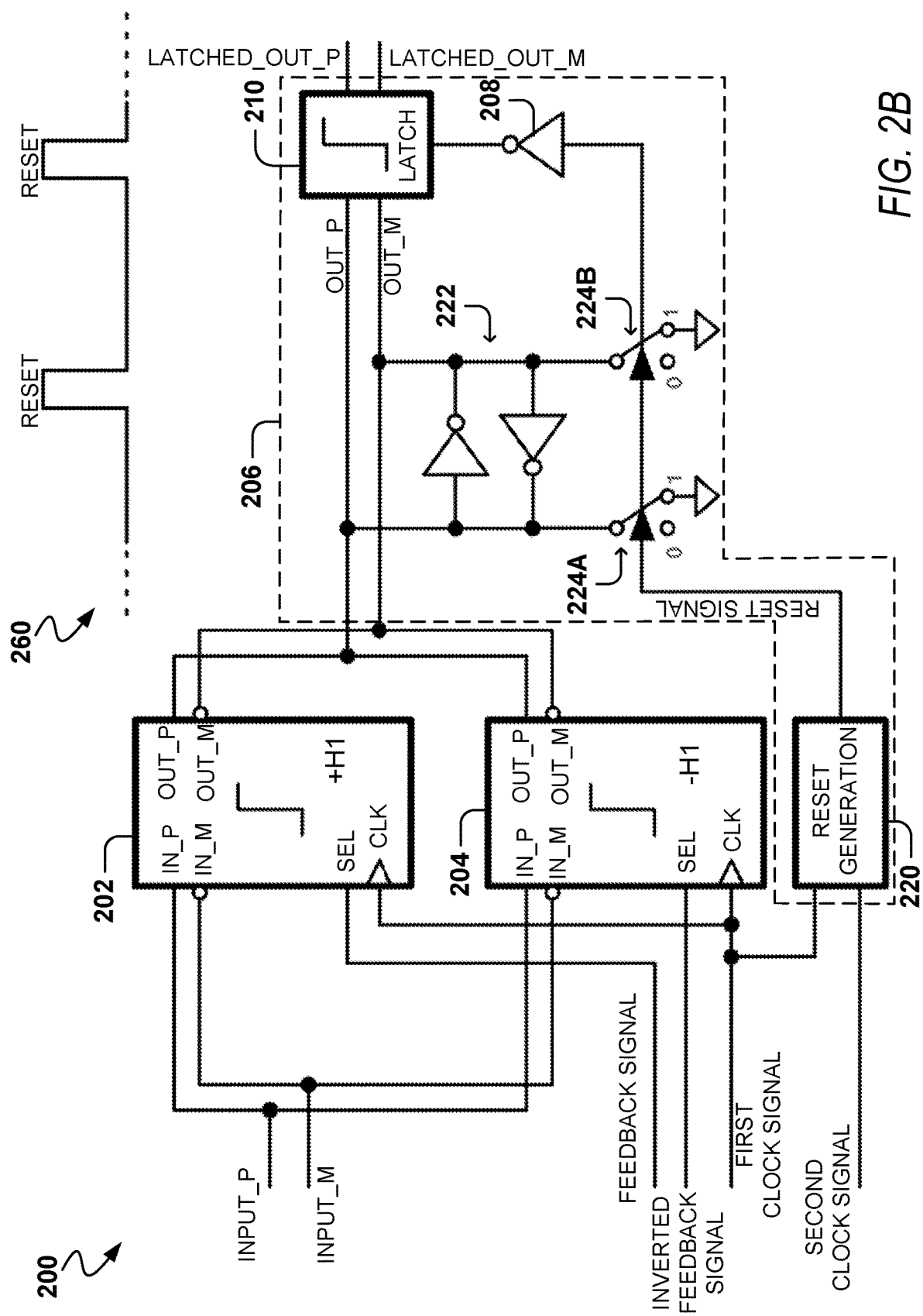

FIG. 2B illustrates an alternative version of the circuit 200. In particular, in FIG. 2B, the reset regeneration block 220 generates the reset signal based on a first clock signal and a second clock, where the first and the second clock signals have a predetermined phase difference (e.g., 90-degree difference). Additionally, in FIG. 2B, a positive output (OUT_P) and a negative output (OUT_M) are coupled to a latch 210, which is driven by an inverse of the reset signal (provided via an inverter 208). The latch 210 can be included in order to preserve the value provided by the regenerative latch portion 206 while the reset signal is active. The values latched by the latch 210 are provided by a positive output (LATCHED_OUT_P) and a negative output (LATCHED_OUT_M).

Figure 3:
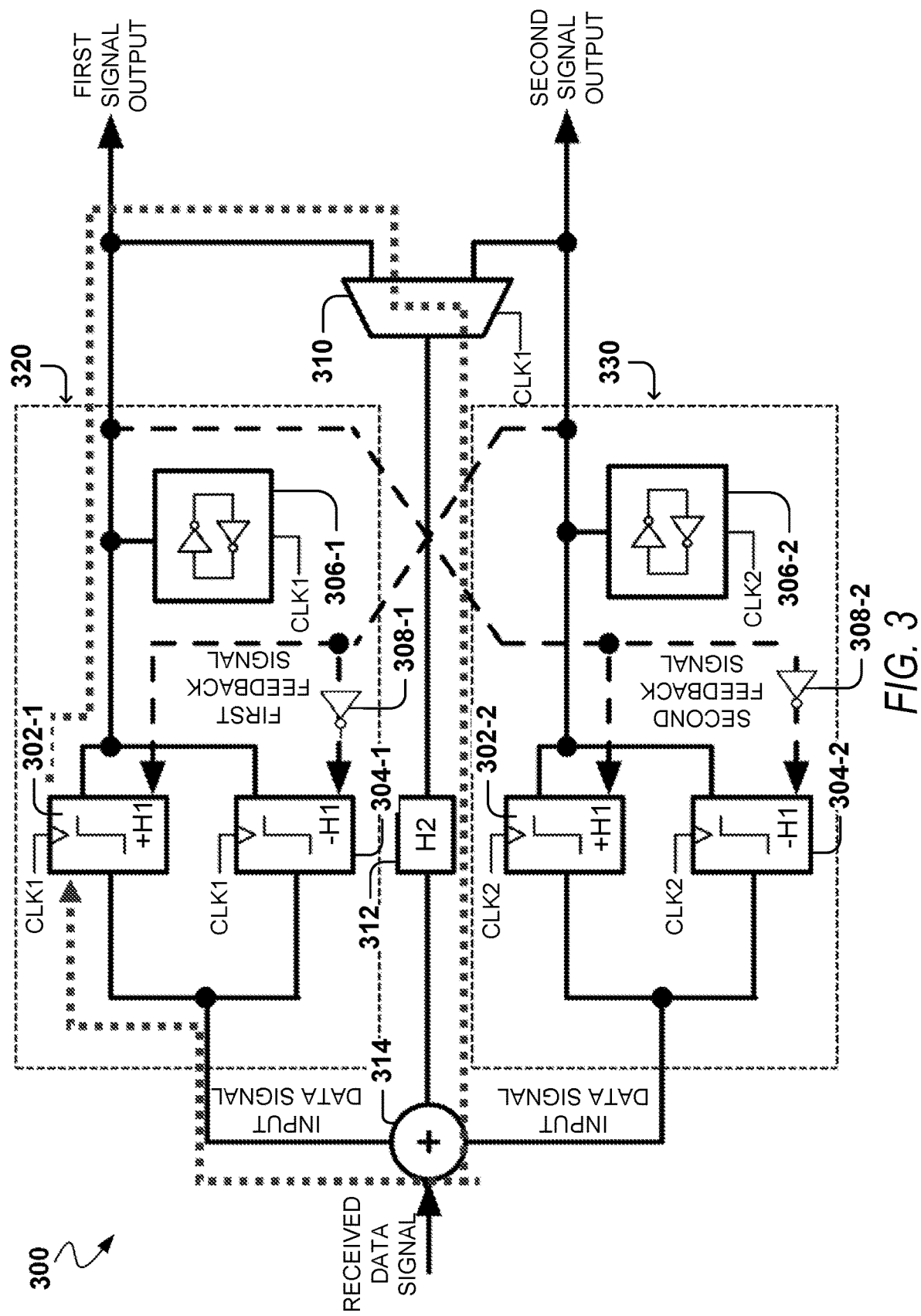

Referring now to FIG. 3, a circuit 300 is illustrated that implements half-rate data sampling with loop-unrolled decision feedback equalization (DFE), in accordance with various embodiments. In FIG. 3, the circuit 300 comprises a first first-tap DFE loop 320, a second first-tap DFE loop 330, a multiplexer 310, a second tap scaling component 312, and an analog summer 314, where the first first-tap DFE loop 320 operates based on a first clock signal (CLK1), and where the second first-tap DFE loop 330 operates based on a second clock signal (CLK2). Each of the first first-tap DFE loop 320 and the second first-tap DFE loop 330 receive an input data signal from an analog summer 314 of the circuit 300, where the first first-tap DFE loop 320 generates and outputs a first sample signal via a first signal output (e.g., representing an even output), and where the second first-tap DFE loop 330 generates and outputs a second sample via a second signal output (e.g., representing an odd output). According to some embodiments, the first first-tap DFE loop 320 represents an implementation of the circuit 100, and the second first-tap DFE loop 330 represents another implementation of the circuit 100. In particular, for some embodiments, elements 302-1, 304-1, 306-1, 308-1 are respectively similar to elements 102, 104, 106, 108 of the circuit 100, and elements 302-2, 304-2, 306-2, 308-2 are respectively similar to elements 102, 104, 106, 108 of the circuit 100.

In FIG. 3, the first feedback signal (e.g., first first-tap feedback signal) for the first first-tap DFE loop 320 comprises an output (e.g., regenerated latched second sampler output signal) of the regenerative latch portion 306-2, and the second feedback signal (e.g., second first-tap feedback signal) for the second first-tap DFE loop 330 comprises an output (e.g., regenerated latched first sampler output signal) of the regenerative latch portion 306-1. For some embodiments, the multiplexer 310 is configured to receive the first clock signal as a multiplexer selection signal, to receive a first regenerated latched sampler output signal from the regenerative latch portion 306-1, to receive a second regenerated latched sampler output signal from the regenerative latch portion 306-2, and to selectively output, based on the multiplexer selection signal, the first regenerated latched sampler output signal or the second regenerated latched sampler output signal as a multiplexer output signal. In various embodiments, the second tap scaling component 312 receives the multiplexer output signal from the multiplexer 310, and generates a second-tap feedback signal (e.g., weight signal) based on a second-tap coefficient (H2) and the multiplexer output signal. The second tap scaling component 312 can comprise, for example, a multiplier that multiplies the multiplexer output signal by the second-tap coefficient. The dashed line can represent one example flow through the circuit 300. For some embodiments, the phase difference between the first clock signal and the second clock signal is 180 degrees.

Figure 4:
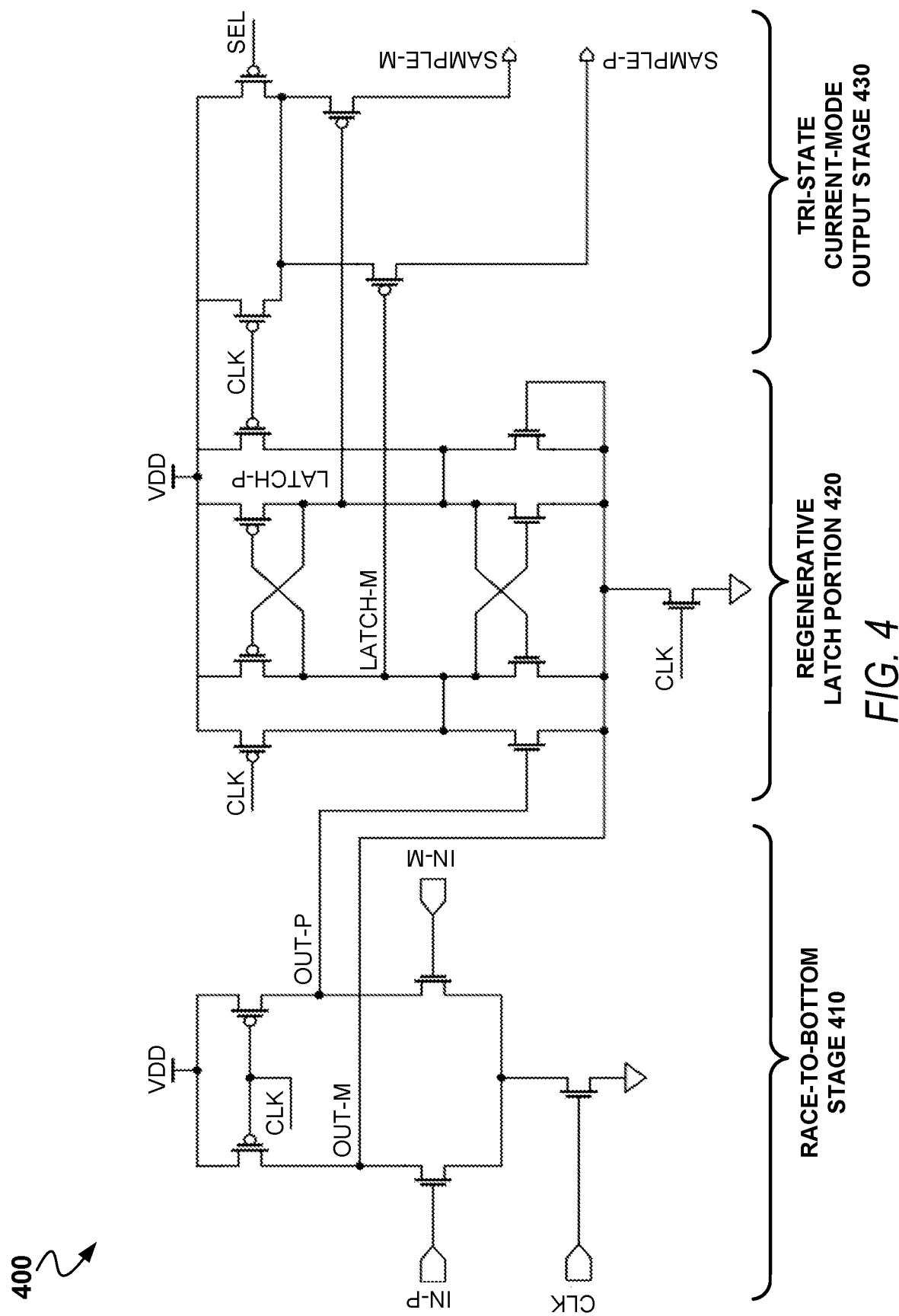

Referring now to FIG. 4, example circuits of a data sampler 400 with a tri-state current-mode output stage 430 are shown, in accordance with various embodiments. In particular, for some embodiments, the circuits of the data sampler 400 represent an example implementation of the data sampler 202 or the data sampler 204 of FIG. 2. As shown, the data sampler 400 comprises a race-to-bottom stage 410, a regenerative latch portion 420 coupled to the race-to-bottom stage 410, and a tri-state current-mode output stage 430 coupled to the regenerative latch portion 420. For some embodiments, race-to-bottom stage 410 generates a first sample based on the clock signal and a first input data signal at a first input (IN-P), and generates a second sample based on the clock signal and a second input data signal at a second input (IN-M). For some embodiments, the regenerative latch portion 420 latches the first sample from the output OUT-P and the second sample from the output OUT-M based on the clock signal, regenerates the latched first sample and the latched second sample, and outputs (to the tri-state current-mode output stage 430) the regenerated latched first sample and the regenerated latched second sample. Additionally, for some embodiments, the tri-state current-mode output stage 430 receives the latched first sample and the latched second sample and outputs them (via outputs SAMPLE-P and SAMPLE-M) if a selection input (SEL) indicates that the tri-state current-mode output stage 430 is active, or blocks/prevents the latched first sample and the latched second sample from being outputted through the tri-state current-mode output stage 430 if the selection input indicates that the tri-state current-mode output stage 430 is inactive (e.g., in a high impedance state).

Figure 5:
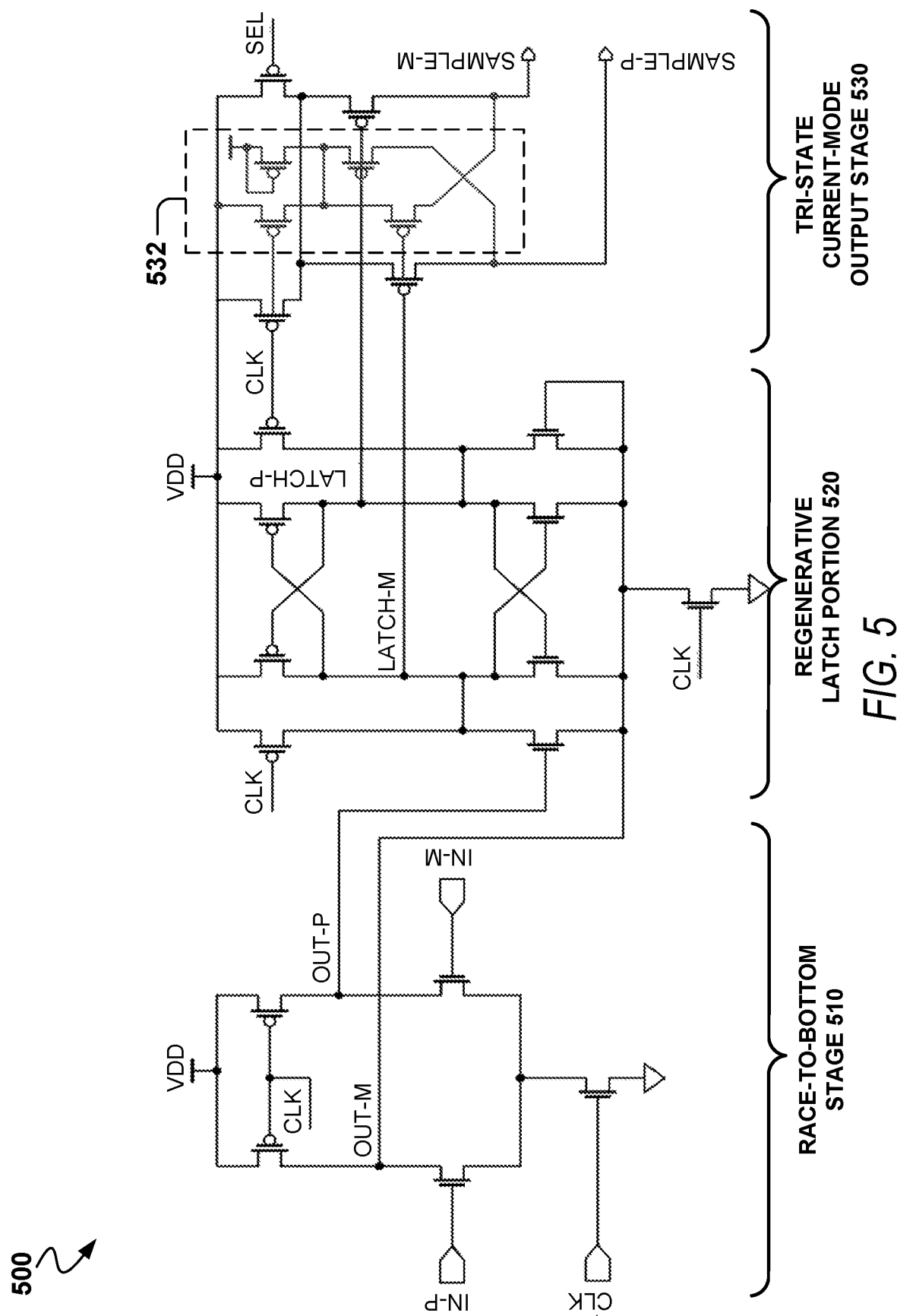

Referring now to FIG. 5, example circuits of a data sampler 500 with a tri-state current-mode output stage 530 are shown, in accordance with various embodiments. In particular, for some embodiments, the circuits of the data sampler 500 are similar to the data sampler 400 and, as such, the race-to-bottom stage 510, the regenerative latch portion 520, and the tri-state current-mode output stage 530 are respectively similar to the race-to-bottom stage 410, the regenerative latch portion 420, and the tri-state current-mode output stage 430 of the data sampler 400. Additionally, the tri-state current-mode output stage 530 includes a set of dummy devices 532 that replicates the output stage of the disabled data sampler and couples between the tri-state current-mode output stage 530 and the regenerative latch portion 520. According to some embodiments, the set of dummy devices 532 mitigates the impact of charge feedthrough, where the set of dummy devices 532 can eliminate any potential dynamic or data-dependent offsets from being introduced by a charge injection of a disabled (e.g., inactive) data sampler.

Figure 6:
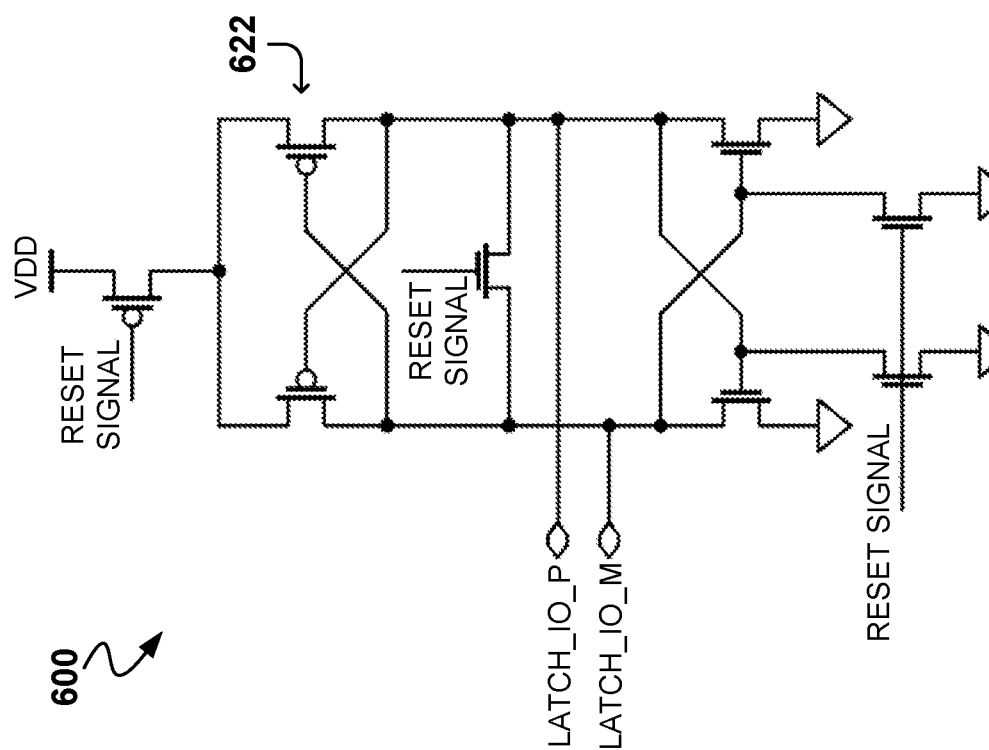

Referring now to FIG. 6, a circuit 600 is illustrated that implements a regenerative latch portion with a reset signal, in accordance with various embodiments. In particular, for some embodiments, the circuit 600 represents an example implementation of the regenerative latch portion 106 of the circuit 100 or the regenerative latch portion 206 of the circuit 200. As shown, the circuit 600 comprises a first input/output (LATCH_IO_P), a second input/output (LATCH_IO_M), and cross-coupled inverters 622. During operation, the circuit 600 can receive a first sample (e.g., from the first data sampler 102) by the first input/output (LATCH_IO_P), receive a second sample (e.g., from the second data sampler 104) by the second input/output (LATCH_IO_M), and latch the first sample and the second sample based on the reset signal (e.g., when reset signal is not asserted, which indicates a regenerative phase). As described herein, the reset signal can comprise an inverted clock signal. For some embodiments, the reset signal is generated such that the regeneration phase is maximized, and the reset phase is kept as short as possible (e.g., as shown by the graph 260 of FIG. 2A). For instance, the reset signal can be asymmetrical such that regeneration time of the regenerative latch portion is maximized.

Figure 7:
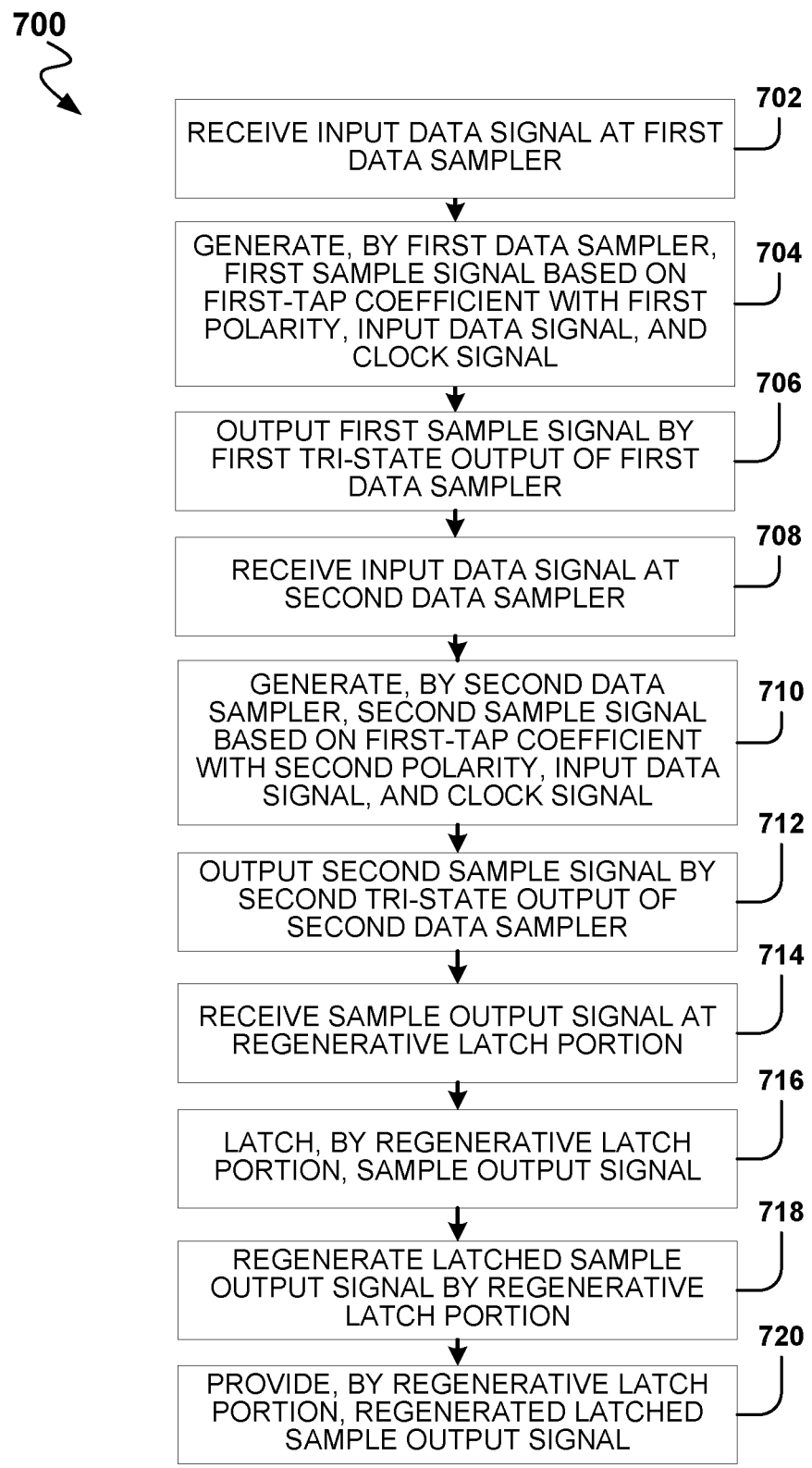
FIG. 7 is a flowchart illustrating an example method for performing data sampling with loop-unrolled decision feedback equalization, in accordance with various embodiments.

FIG. 7 is a flowchart illustrating an example method 700 for performing data sampling with loop-unrolled decision feedback equalization (DFE), in accordance with various embodiments. Some or all of the method 700 can be performed by a circuit, such as one or more of the circuits/components described herein with respect to FIGS. 1 through 6. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

At operation 702, an input data signal is received at a first data sampler (e.g., 102). The first data sampler (e.g., 102), at operation 704, generates a first sample signal based on a first-tap coefficient with a first polarity (e.g., +H1), the input data signal (received at operation 702) and a clock signal. Thereafter, at operation 706, a first tri-state output of the first data sampler (e.g., 102) outputs the first sample signal (generated at operation 704). For some embodiments, only one of the first data sampler and the second data sampler is actually allowed to contribute to the regeneration latch portion. For some embodiments, the first tri-state output is controlled based on a first selection signal received by the first data sampler (e.g., 102). Additionally, according to various embodiments, the first selection signal is based on (e.g., comprises) a feedback signal, which can represent a preceding bit.

Like with the first data sampler, at operation 708, a second data sampler (e.g., 104) receives the input data signal. The second data sampler (e.g., 104), at operation 710, generates a second sample signal based on the first-tap coefficient with a second polarity (e.g., −H1), the input data signal (received at operation 708) and the clock signal. Thereafter, at operation 712, a second tri-state output of the second data sampler (e.g., 104) outputs the second sample signal (generated at operation 710). For some embodiments, the second tri-state output is controlled based on a second selection signal received by the second data sampler (e.g., 104). Additionally, according to various embodiments, the second selection signal is generated based on the feedback signal (e.g., second selection signal comprises the inversion of the feedback signal).

Eventually, at operation 714, a regenerative latch portion (e.g., 106) receives a sampler output signal from at least one of the tri-state output of the first data sampler (e.g., 102) or the tri-state output of the second data sampler (e.g., 104). The regenerative latch portion (e.g., 106) latches the sampler output signal at operation 716, and regenerates the latched sampler output signal at operation 718. The regenerative latch portion (e.g., 106) provides the regenerated latched sampler output signal at operation 720.

Figure 8:
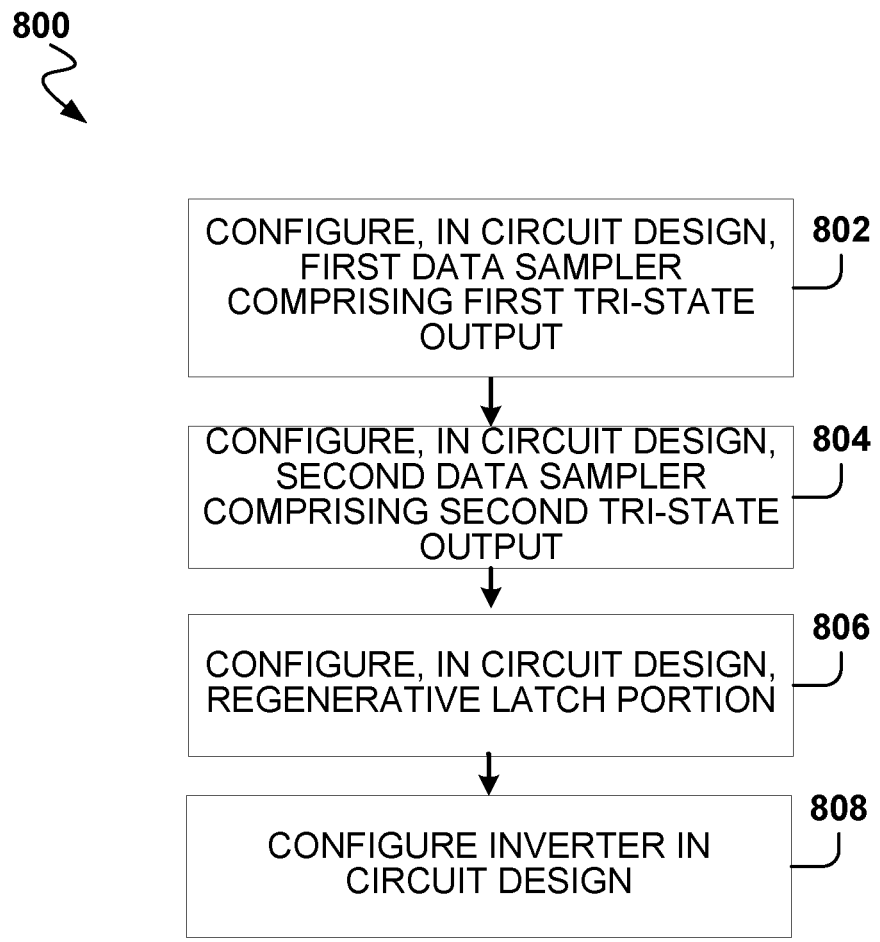
FIG. 8 is a flowchart illustrating an example method for generating a circuit design that includes data sampling with loop-unrolled decision feedback equalization, in accordance with some embodiments.

FIG. 8 is a flowchart illustrating an example method 800 for generating a circuit design that includes data sampling with loop-unrolled decision feedback equalization (DFE), in accordance with some embodiments. It will be understood that the method 800 can be performed by a device, such as a computing device executing instructions of an EDA software system, in accordance with some embodiments. Additionally, the method 800 herein can be implemented in the form of executable instructions stored on a computer-readable medium or in the form of electronic circuitry. For instance, the operations of the method 800 may be represented by executable instructions that, when executed by a processor of a computing device, cause the computing device to perform the method 800.

Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel. Further, for some embodiments, a method described herein may have more or fewer operations than otherwise depicted.

Depending on the embodiment, the method 800 can implement within a circuit design one or more of the circuits described with respect to FIGS. 1 through 6.

At operation 802, a first data sampler is configured in a circuit design, where the first data sampler comprises a first sampler input, a first selection input, and a first tri-state output. For some embodiments, the first data sampler is configured to receive an input data signal by the first sampler input, to generate a first sample signal based on a first-tap coefficient with a first polarity, the input data signal and a clock signal, and to output the first sample signal by the first tri-state output, where the first tri-state output is controlled based on a first selection signal received by the first selection input, and where the first selection signal is based on (e.g., comprises) a feedback signal.

Similarly, at operation 804, a second data sampler is configured in the circuit design, where the second data sampler comprises a second sampler input, a second selection input, and a second tri-state output. For some embodiments, the second data sampler is configured to receive the input data signal by the second sampler input, to generate a second sample signal based on the first-tap coefficient with a second polarity, the input data signal, and the clock signal, and to output the second sample signal by the second tri-state output, where the second tri-state output is controlled based on a second selection signal received by the second selection input.

A regenerative latch portion is configured in the circuit design at operation 806, where the regenerative latch portion is coupled to the first tri-state output (of the first data sampler) and the second tri-state output (of the second data sampler). For some embodiments, the regenerative latch portion is configured to receive a sampler output signal from at least one of the first tri-state output or the second tri-state output, to latch the sampler output signal based on the clock signal, to regenerate the latched sampler output signal, and to provide the regenerated latched sampler output signal.

At operation 808, an inverter coupled to the second selection input is configured in the circuit design, where the inverter is configured to receive the feedback signal, to generate an inverted feedback signal, and to output the inverted feedback signal to the second selection input. As noted herein, for some embodiments, an inverter is not used or included to generate an inverted feedback signal. Rather, the inverted feedback signal can be generated as part of an output provided by the regenerative latch portion (e.g., 106). For example, the regenerative latch portion can provide a differential pair of output signals that are complementary (e.g., as in FIG. 2) and, accordingly, a prior stage output signal of the differential pair (e.g., for a preceding bit) can be used as the feedback signal for the first data sampler and the other output signal of the differential pair (e.g., for a preceding bit) can be used as the inverted feedback signal for the second data sampler.

Figure 9:
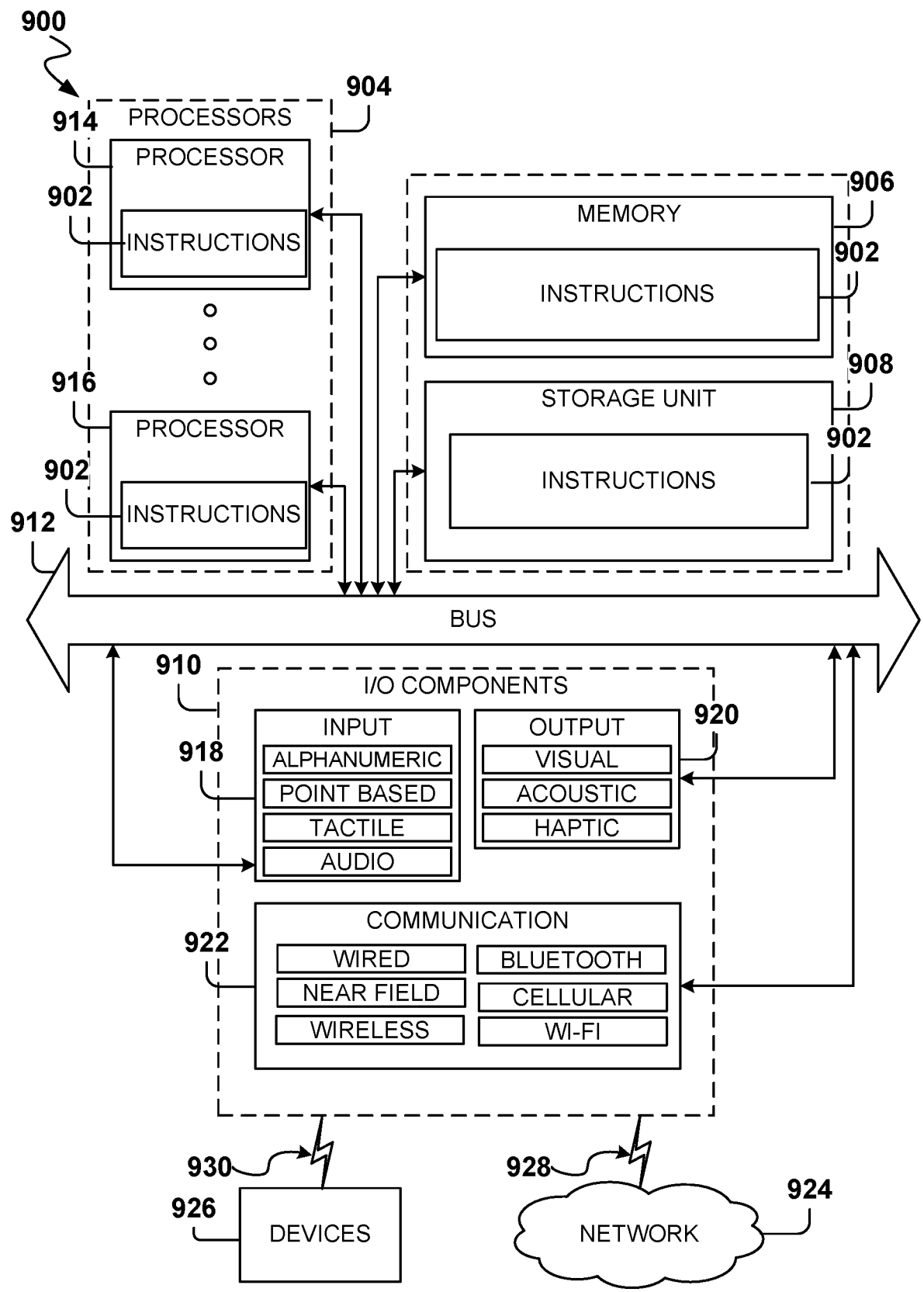
FIG. 9 is a block diagram illustrating components of a machine, according to some example embodiments, able to read instructions from a machine-readable medium and perform any one or more of the methodologies discussed herein.

FIG. 9 is a block diagram illustrating components of a machine 900, according to some example embodiments, able to read instructions from a machine-readable medium (e.g., a machine-readable storage medium) and perform any one or more of the methodologies discussed herein. Specifically, FIG. 9 shows a diagrammatic representation of the machine 900 in the example form of a system within which instructions 902 (e.g., software, a program, an application, an applet, an app, a driver, or other executable code) for causing the machine 900 to perform any one or more of the methodologies discussed herein may be executed. For example, the instructions 902 include executable code that causes the machine 900 to execute the method 800 described with respect to FIG. 8. In this way, these instructions 902 transform the general, non-programmed machine 900 into a particular machine programmed to carry out the described and illustrated method 800 in the manner described herein. The machine 900 may operate as a standalone device or may be coupled (e.g., networked) to other machines.

By way of non-limiting example, the machine 900 may comprise or correspond to a television, a computer (e.g., a server computer, a client computer, a personal computer (PC), a tablet computer, a laptop computer, or a netbook), a personal digital assistant (PDA), a smart phone, a mobile device, or any machine capable of executing the instructions 902, sequentially or otherwise, that specify actions to be taken by the machine 900. Further, while only a single machine 900 is illustrated, the term "machine" shall also be taken to include a collection of machines 900 that individually or jointly execute the instructions 902 to perform any one or more of the methodologies discussed herein.

The machine 900 may include processors 904, memory 906, a storage unit 908, and I/O components 910, which may be configured to communicate with each other such as via a bus 912. In an example embodiment, the processors 904 (e.g., a central processing unit (CPU), a reduced instruction set computing (RISC) processor, a complex instruction set computing (CISC) processor, a graphics processing unit (GPU), a digital signal processor (DSP), an application specific integrated circuit (ASIC), a radio-frequency integrated circuit (RFIC), another processor, or any suitable combination thereof) may include, for example, a processor 914 and a processor 916 that may execute the instructions 902. The term "processor" is intended to include multi-core processors 904 that may comprise two or more independent processors (sometimes referred to as "cores") that may execute instructions 902 contemporaneously. Although FIG. 9 shows multiple processors 904, the machine 900 may include a single processor with a single core, a single processor with multiple cores (e.g., a multi-core processor), multiple processors with a single core, multiple processors with multiple cores, or any combination thereof.

The memory 906 (e.g., a main memory or other memory storage) and the storage unit 908 are both accessible to the processors 904 such as via the bus 912. The memory 906 and the storage unit 908 store the instructions 902 embodying any one or more of the methodologies or functions described herein. The instructions 902 may also reside, completely or partially, within the memory 906, within the storage unit 908, within at least one of the processors 904 (e.g., within the processor's cache memory), or any suitable combination thereof, during execution thereof by the machine 900. Accordingly, the memory 906, the storage unit 908, and the memory of the processors 904 are examples of machine-readable media.

As used herein, "machine-readable medium" means a device able to store instructions and data temporarily or permanently and may include, but is not limited to, random-access memory (RAM), read-only memory (ROM), buffer memory, flash memory, optical media, magnetic media, cache memory, other types of storage (e.g., erasable programmable read-only memory (EEPROM)), and/or any suitable combination thereof. The term "machine-readable medium" should be taken to include a single medium or multiple media (e.g., a centralized or distributed database, or associated caches and servers) able to store the instructions 902. The term "machine-readable medium" shall also be taken to include any medium, or combination of multiple media, that is capable of storing instructions (e.g., instructions 902) for execution by a machine (e.g., machine 900), such that the instructions, when executed by one or more processors of the machine (e.g., processors 904), cause the machine to perform any one or more of the methodologies described herein (e.g., method 800). Accordingly, a "machine-readable medium" refers to a single storage apparatus or device, as well as "cloud-based" storage systems or storage networks that include multiple storage apparatus or devices. The term "machine-readable medium" excludes signals per se.

Furthermore, the "machine-readable medium" is non-transitory in that it does not embody a propagating signal. However, labeling the tangible machine-readable medium as "non-transitory" should not be construed to mean that the medium is incapable of movement—the medium should be considered as being transportable from one real-world location to another. Additionally, since the machine-readable medium is tangible, the medium may be considered to be a machine-readable device.

The I/O components 910 may include a wide variety of components to receive input, provide output, produce output, transmit information, exchange information, capture measurements, and so on. The specific I/O components 910 that are included in a particular machine 900 will depend on the type of the machine 900. For example, portable machines such as mobile phones will likely include a touch input device or other such input mechanisms, while a headless server machine will likely not include such a touch input device. It will be appreciated that the I/O components 910 may include many other components that are not specifically shown in FIG. 9. The I/O components 910 are grouped according to functionality merely for simplifying the following discussion and the grouping is in no way limiting. In various example embodiments, the I/O components 910 may include input components 918 and output components 920. The input components 918 may include alphanumeric input components (e.g., a keyboard, a touch screen configured to receive alphanumeric input, a photooptical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components, and the like. The output components 920 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth.

Communication may be implemented using a wide variety of technologies. The I/O components 910 may include communication components 922 operable to couple the machine 900 to a network 924 or devices 926 via a coupling 928 and a coupling 930 respectively. For example, the communication components 922 may include a network interface component or another suitable device to interface with the network 924. In further examples, the communication components 922 may include wired communication components, wireless communication components, cellular communication components, near field communication (NFC) components, Bluetooth® components (e.g., Bluetooth® Low Energy), Wi-Fi® components, and other communication components to provide communication via other modalities. The devices 926 may be another machine or any of a wide variety of peripheral devices.

Modules, Components and Logic

Certain embodiments are described herein as including logic or a number of components, modules, or mechanisms. Modules may constitute either software modules (e.g., code embodied on a machine-readable medium or in a transmission signal) or hardware modules. A hardware module is a tangible unit capable of performing certain operations and may be configured or arranged in a certain manner. In example embodiments, one or more computer systems (e.g., a standalone, client, or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field-programmable gate array (FPGA) or an ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner and/or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses that connect the hardware modules). In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., APIs).

Electronic Apparatus and System

Embodiments may be implemented in digital electronic circuitry, in computer hardware, firmware, or software, or in combinations of them. Embodiments may be implemented using a computer program product, for example, a computer program tangibly embodied in an information carrier, for example, in a machine-readable medium for execution by, or to control the operation of, data processing apparatus, for example, a programmable processor, a computer, or multiple computers.

A computer program can be written in any form of programming language, including compiled or interpreted languages, and it can be deployed in any form, including as a standalone program or as a module, subroutine, or other unit suitable for use in a computing environment. A computer program can be deployed to be executed on one computer or on multiple computers at one site, or distributed across multiple sites and interconnected by a communication network.

In example embodiments, operations may be performed by one or more programmable processors executing a computer program to perform functions by operating on input data and generating output. Method operations can also be performed by, and apparatus of example embodiments may be implemented as, special purpose logic circuitry (e.g., an FPGA or an ASIC).

The computing system can include clients and servers. A client and server are generally remote from each other and typically interact through a communication network. The relationship of client and server arises by virtue of computer programs running on the respective computers and having a client-server relationship to each other. In embodiments deploying a programmable computing system, it will be appreciated that both hardware and software architectures merit consideration. Specifically, it will be appreciated that the choice of whether to implement certain functionality in permanently configured hardware (e.g., an ASIC), in temporarily configured hardware (e.g., a combination of software and a programmable processor), or in a combination of permanently and temporarily configured hardware may be a design choice.

Figure 10:
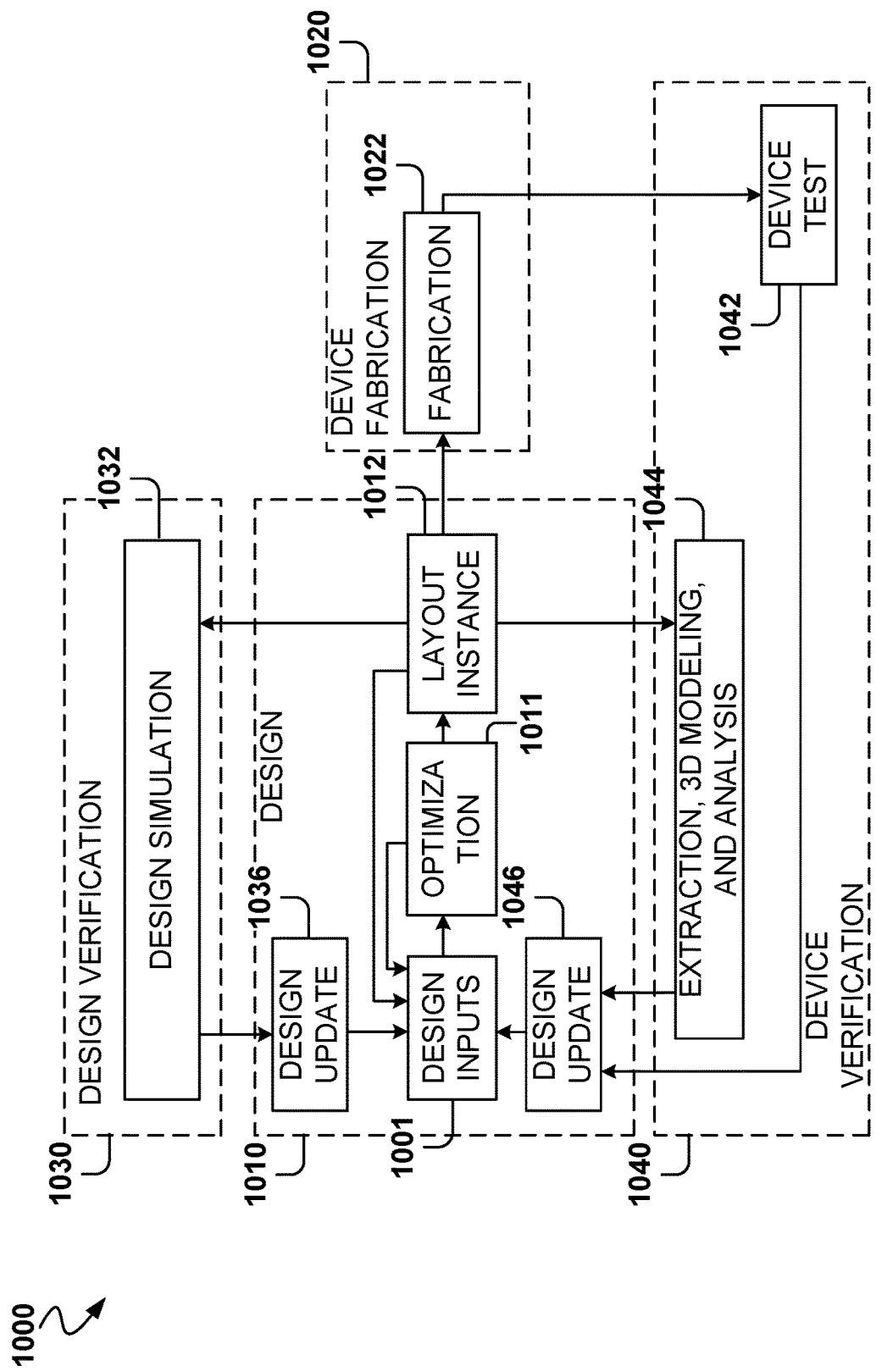
FIG. 10 is a diagram illustrating one possible design process flow for generating a circuit, including embodiments to implement data sampling with loop-unrolled decision feedback equalization as described herein, and in various embodiments, to integrate the circuit with a larger circuit.

FIG. 10 is a diagram illustrating one possible design process flow for generating a circuit, including embodiments to implement data sampling with loop-unrolled decision feedback equalization as described herein, and in various embodiments, to integrate the circuit with a larger circuit. As illustrated, the overall design flow 1000 includes a design phase 1010, a device fabrication phase 1020, a design verification phase 1030, and a device verification phase 1040. The design phase 1010 involves an initial design input operation 1001 where the basic elements and functionality of a device are determined, as well as revisions based on various analyses and optimization of a circuit design. This design input operation 1001 is where instances of an EDA circuit design file are used in the design and any additional circuitry is selected. The initial strategy, tactics, and context for the device to be created are also generated in the design input operation 1001, depending on the particular design algorithm to be used.

In some embodiments, following an initial selection of design values in the design input operation 1001, timing analysis and optimization according to various embodiments occurs in an optimization operation 1011, along with any other automated design processes. One such process may be the automated design of a partitioned root search for error locator polynomial functions in RS FEC decoding. As described below, design constraints for blocks of a circuit design generated with design inputs in the design input operation 1001 may be analyzed using hierarchical timing analysis, according to various embodiments. While the design flow 1000 shows such optimization occurring prior to a layout instance 1012, such hierarchical timing analysis and optimization may be performed at any time to verify operation of a circuit design. For example, in various embodiments, constraints for blocks in a circuit design may be generated prior to routing of connections in the circuit design, after routing, during register transfer level (RTL) operations, or as part of a final signoff optimization or verification prior to a device fabrication operation 1022.

After design inputs are used in the design input operation 1001 to generate a circuit layout, and any optimization operations 1011 are performed, a layout is generated in the layout instance 1012. The layout describes the physical layout dimensions of the device that match the design inputs. This layout may then be used in the device fabrication operation 1022 to generate a device, or additional testing and design updates may be performed using designer inputs or automated updates based on design simulation 1032 operations or extraction, 3D modeling, and analysis 1044 operations. Once the device is generated, the device can be tested as part of device test 1042 operations, and layout modifications generated based on actual device performance.

As described in more detail below, design updates 1036 from the design simulation 1032, design updates 1046 from the device test 1042, the extraction, 3D modeling, and analysis 1044 operations, or the design input operation 1001 may occur after an initial layout instance 1012 is generated. In various embodiments, whenever design inputs are used to update or change an aspect of a circuit design, a timing analysis and optimization operation 1011 may be performed.

For example, in various embodiments, a user may provide an input to a computing device indicating placement of elements of a circuit within a portion of a circuit design, including description of circuitry for a multi-channel memory interface described herein. An output to a display of the computing device may show details of a circuit design, and may further be used to generate results of the timing analysis, or may show recommended optimizations or automatically performed adjustments to the circuit design based on the timing analysis. Further inputs to the computing device may involve adjustments as user design inputs, with additional timing analysis and optimization initiated via user operation of the computing device. In some embodiments, a computing device may be used to generate circuit design files describing circuitry corresponding to embodiments described herein. Such circuit design files may be used as outputs to generate photolithographic masks or other control files and components used to generate circuits that operate in accordance with various embodiments described herein.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component.

Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, components, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A circuit comprising:
a first data sampler comprising a first sampler input, a first selection input, and a first tri-state output, the first data sampler being configured to receive an input data signal by the first sampler input, to generate a first sample signal based on a first-tap coefficient with a first polarity, the input data signal and a clock signal, and to output the first sample signal by the first tri-state output, the first tri-state output being controlled based on a first selection signal received by the first selection input, the first selection signal being based on a feedback signal;
a second data sampler comprising a second sampler input, a second selection input, and a second tri-state output, the second data sampler being configured to receive the input data signal by the second sampler input, to generate a second sample signal based on the first-tap coefficient with a second polarity, the input data signal, and the clock signal, and to output the second sample signal by the second tri-state output, the second tri-state output being controlled based on a second selection signal received by the second selection input, the second selection signal being based on an inverted feedback signal; and
a regenerative latch portion coupled to the first tri-state output and the second tri-state output, the regenerative latch portion being configured to receive a sampler output signal from at least one of the first tri-state output or the second tri-state output, to latch the sampler output signal based on the clock signal, to regenerate the latched sampler output signal, and to provide the regenerated latched sampler output signal.

2. The circuit of claim 1, wherein the input data signal comprises a differential pair of data signals.

3. The circuit of claim 1, wherein the first-tap coefficient with the first polarity and the first-tap coefficient with the second polarity are associated with a first tap of a decision feedback equalizer implemented by the circuit.

4. The circuit of claim 1, wherein the regenerative latch portion comprises a cross-coupled inverter.

5. The circuit of claim 4, wherein the regenerative latch portion comprises a reset input to receive a reset signal, the reset signal being generated based on the clock signal.

6. The circuit of claim 5, wherein the reset signal is asymmetrical such that regeneration time of the regenerative latch portion is maximized.

7. The circuit of claim 1, wherein each of the first and the second data samplers has a signal output operating in current mode.

8. The circuit of claim 1, wherein the first tri-state output is disabled in response to the first selection signal indicating selection of a disabled state.

9. The circuit of claim 1, wherein the first tri-state output is enabled in response to the first selection signal indicating selection of an enabled state.

10. The circuit of claim 1, wherein the first data sampler comprises a first set of dummy devices that couples between the first tri-state output and the regenerative latch portion, and wherein the second data sampler comprises a second set of dummy devices that couples between the second tri-state output and the regenerative latch portion.

11. The circuit of claim 1, wherein the clock signal is a first clock signal, wherein the feedback signal is a first feedback signal, wherein the regenerative latch portion is a first regenerative latch portion, wherein the sampler output signal is a first sampler output signal, wherein the latched sampler output signal is a first latched sampler output signal, wherein the regenerated latched sampler output signal is a first regenerated latched sampler output signal, wherein the inverted feedback signal is an inverted first feedback signal, and wherein the circuit comprises:
a third data sampler comprising a third sampler input, a third selection input, and a third tri-state output, the third data sampler being configured to receive the input data signal by the third sampler input, to generate a third sample signal based on the first-tap coefficient with the first polarity, the input data signal, and a clock signal, and to output the third sample signal by the third tri-state output, the third tri-state output being controlled based on a third selection signal received by the third selection input, and the third selection signal being based on a second feedback signal;
a fourth data sampler comprising a fourth sampler input, a fourth selection input, and a fourth tri-state output, the fourth data sampler being configured to receive the input data signal by the fourth sampler input, to generate a fourth sample signal based on the first-tap coefficient with the second polarity, the input data signal, and the clock signal, and to output the fourth sample signal by the fourth tri-state output, the fourth tri-state output being controlled based on a fourth selection signal received by the fourth selection input, the fourth selection signal being based on an inverted second feedback signal; and a second regenerative latch portion coupled to the third tri-state output and the fourth tri-state output, the second latch portion being configured to receive a second sampler output signal from at least one of the third tri-state output or the fourth tri-state output, to latch the second sampler output signal based on the second clock signal, to regenerate the second latched sampler output signal, and to provide the second regenerated latched sampler output signal, the first feedback signal comprising the second regenerated sampler output signal, and the second feedback signal comprising the first regenerated sampler output signal.

12. The circuit of claim 11, comprising:

a multiplexer comprising a multiplexer selection input to receive a multiplexer selection signal, the multiplexer selection signal being generated based on the first clock signal, and the multiplexer being configured to receive the first regenerated latched sampler output signal from the first regenerative latch portion, to receive the second regenerated latched sampler output signal from the second regenerative latch portion, and to selectively output, based on the multiplexer selection signal, the first regenerated latched sampler output signal or the second regenerated latched sampler output signal as a multiplexer output signal;

a second tap scaling component to receive the multiplexer output signal and to generate a second-tap feedback signal based on a second-tap coefficient and the multiplexer output signal; and an analog summer to receive a received data signal, to receive the second-tap feedback signal, and to generate the input data signal by applying the second-tap feedback signal to the received data signal.

13. The circuit of claim 1, wherein the regenerative latch portion comprises an additional latch configured to preserve the regenerated latched sampler output signal when the regenerative latch portion enters a reset phase.

14. A non-transitory computer-readable medium comprising instructions that, when executed by one or more processors of a computing device, cause the computing device to generate a circuit design by performing operations comprising:

configuring, in a circuit design, a first data sampler that comprises a first sampler input, a first selection input, and a first tri-state output, the first data sampler being configured to receive an input data signal by the first sampler input, to generate a first sample signal based on a first-tap coefficient with a first polarity, the input data signal and a clock signal, and to output the first sample signal by the first tri-state output, the first tri-state output being controlled based on a first selection signal received by the first selection input, the first selection signal being based on a feedback signal;

configuring, in the circuit design, a second data sampler that comprises a second sampler input, a second selection input, and a second tri-state output, the second data sampler being configured to receive the input data signal by the second sampler input, to generate a second sample signal based on the first-tap coefficient with a second polarity, the input data signal, and the clock signal, and to output the second sample signal by the second tri-state output, the second tri-state output being controlled based on a second selection signal received by the second selection input, the second selection signal being based on an inverted feedback signal; and configuring, in the circuit design, a regenerative latch portion coupled to the first tri-state output and the second tri-state output, the regenerative latch portion being configured to receive a sampler output signal from at least one of the first tri-state output or the second tri-state output, to latch the sampler output signal based on the clock signal, to regenerate the latched sampler output signal, and to provide the regenerated latched sampler output signal.

15. The non-transitory computer-readable medium of claim 14, wherein the first tri-state output is disabled in response to the first selection signal indicating selection of a disabled state.

16. The non-transitory computer-readable medium of claim 15, wherein the first tri-state output is disabled by being set to a high-impedance state.

17. The non-transitory computer-readable medium of claim 14, wherein the first tri-state output is enabled in response to the first selection signal indicating selection of an enabled state.

18. The non-transitory computer-readable medium of claim 14, wherein the first data sampler comprises:

a first dummy device that couples between the first tri-state output and the regenerative latch portion.

19. A method comprising:

receiving, at a first data sampler, an input data signal;

generating, by the first data sampler, a first sample signal based on a first-tap coefficient with a first polarity, the input data signal and a clock signal;

outputting, by a first tri-state output of the first data sampler, the first sample signal, the first tri-state output being controlled based on a first selection signal received by the first data sampler, the first selection signal being based on a feedback signal;

receiving, at a second data sampler, the input data signal;

generating, by the second data sampler, a second sample signal based on a positive second-tap coefficient, the input data signal and the clock signal;

outputting, by a second tri-state output of the second data sampler, the second sample signal, the second tri-state output being controlled based on a second selection signal received by the second data sampler, the second selection signal being based on the feedback signal, the second selection signal being based on an inverted feedback signal;

receiving, at a regenerative latch portion, a sampler output signal from at least one of the first tri-state output or the second tri-state output, the regenerative latch portion being coupled to the first tri-state output or the second tri-state output;

latching, by the regenerative latch portion, the sampler output signal;

regenerating, by the regenerative latch portion, the latched sampler output signal; and providing, by the regenerative latch portion, the regenerated latched sampler output signal.

20. The method of claim 19, wherein the first data sampler comprises a first set of dummy devices that couples between the first tri-state output and the regenerative latch portion, and wherein the second data sampler comprises a second set of dummy devices that couples between the second tri-state output and the regenerative latch portion.

* * * * *